(12) United States Patent
Khanna et al.

(10) Patent No.: US 7,920,398 B1
(45) Date of Patent: Apr. 5, 2011

(54) ADAPTIVE MATCH LINE CHARGING

(75) Inventors: Sandeep Khanna, Los Altos, CA (US); Bindiganavale S. Nataraj, Cupertino, CA (US); Chetan Deshpande, San Jose, CA (US); Vinay Iyengar, Cupertino, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 0 days.

(21) Appl. No.: 12/887,267

(22) Filed: Sep. 21, 2010

(51) Int. Cl.
*G11C 15/00* (2006.01)
(52) U.S. Cl. .................................. 365/49.1; 365/49.17
(58) Field of Classification Search ................. 365/49.1, 365/49.17
See application file for complete search history.

(56) References Cited

U.S. PATENT DOCUMENTS

| 6,125,049 | A | 9/2000 | Nataraj |
| 6,147,891 | A | 11/2000 | Nataraj |
| 6,166,939 | A | 12/2000 | Nataraj et al. |
| 6,191,969 | B1 | 2/2001 | Pereira |
| 6,243,280 | B1 | 6/2001 | Wong et al. |
| 6,430,074 | B1 | 8/2002 | Srinivasan |
| 6,804,133 | B1 | 10/2004 | Khanna |
| 7,050,318 | B1 | 5/2006 | Argyres |
| 7,113,415 | B1 | 9/2006 | Khanna |
| 7,193,874 | B1 * | 3/2007 | Pereira et al. ............ 365/189.15 |
| 7,800,930 | B1 | 9/2010 | Deshpande et al. |
| 7,852,652 | B1 | 12/2010 | Fabry |

* cited by examiner

*Primary Examiner* — Jason Lappas

(74) *Attorney, Agent, or Firm* — Mahamedi Paradice Kreisman LLP; William L. Paradice, III

(57) ABSTRACT

A content addressable memory (CAM) device having any number of rows, each of the rows including a match line connected to a plurality of CAM cells, a match line detector circuit, and a pre-charge circuit. The detector circuit detects a voltage of the match line and generates a feedback signal based on the detected match line voltage. The pre-charge circuit adaptively charges the match line in response to the feedback signal.

23 Claims, 10 Drawing Sheets

ADAPTIVE MATCH LINE CHARGING

TECHNICAL FIELD

The present invention relates generally to content addressable memories and specifically to improving performance of content addressable memories.

BACKGROUND OF RELATED ART

A content addressable memory (CAM) device is a storage device having an array of memory cells that can be instructed to compare the specific pattern of a comparand word with data words stored in corresponding rows of the array. During a compare operation, the comparand word is provided to the CAM array and compared with all the CAM words. For each CAM word that matches the comparand word, a corresponding match line is asserted to indicate the match result. If any of the match lines are asserted, a match flag is asserted to indicate the match condition, and a priority encoder determines the match address or index of the highest priority matching entry in the CAM array.

Typically, the match lines of the CAM array are pre-charged (e.g., to a logic high state indicative of a logic "1" value) prior to the compare operation. During the compare operation, if all CAM cells in a row match the comparand data, the CAM cells do not discharge the row's match line, which remains in its charged state to indicate a match condition for the row. Conversely, if any CAM cell in the row does not match the comparand data, the CAM cell discharges the match line (e.g., to a logic low state indicative of a logic "0" value) to indicate a mismatch condition for the row. The discharged match lines are pre-charged to the supply voltage for the next compare operation.

Variations in operating conditions (e.g., temperature) and/or load may cause the voltage level of the pre-charged match lines to undesirably fluctuate. To account for such fluctuations, the match lines are typically pre-charged to a high voltage level to ensure that the voltage of the pre-charged match lines remains at or above a detectable threshold level (e.g., so that match latches coupled to the match lines can readily distinguish between a match condition and a mismatch condition during compare operations). However, this typically requires pre-charging the match lines to a full rail voltage (e.g., to the supply voltage), and may result in significant power consumption. This power consumption increases as the size and/or density of the CAM array increases and, therefore, undesirably limits the memory size and the scalability of the CAM array. Thus, it would be desirable to reduce the power consumption associated with charging the match lines of a CAM array for compare operations.

BRIEF DESCRIPTION OF THE DRAWINGS

The present embodiments are illustrated by way of example and not intended to be limited by the figures of the accompanying drawings, where.

Like reference numerals refer to corresponding parts throughout the drawing figures.

DETAILED DESCRIPTION

Figure 1:
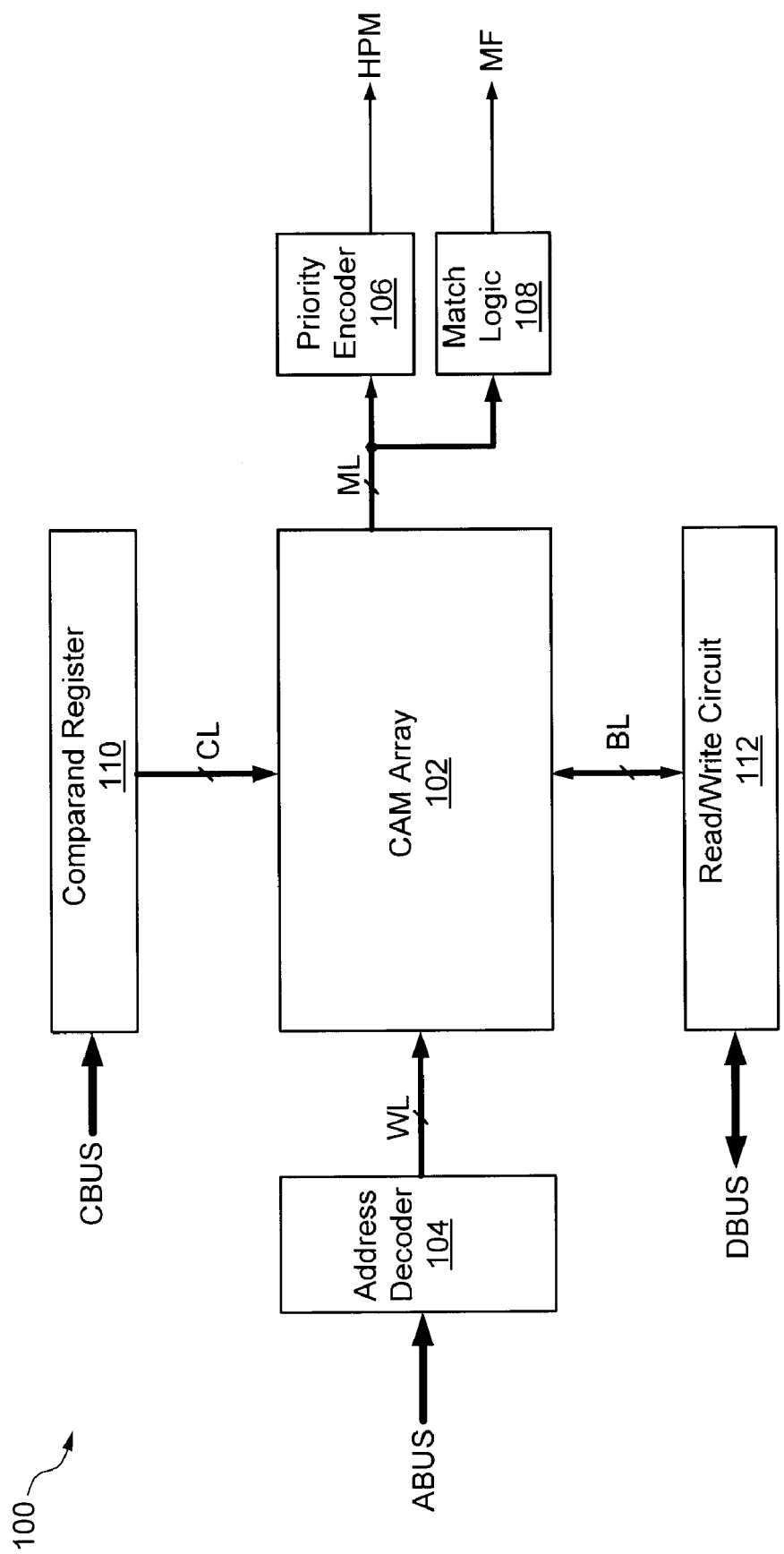
FIG. 1 shows a content addressable memory (CAM) device within which present embodiments may be implemented.

A method and apparatus for adaptively charging the match lines of a CAM array are disclosed below in the context of a row of CAM cells for simplicity only. It is to be understood that the present embodiments may be used in any suitable CAM array or device including, for example, either NOR or NAND type CAM arrays. In the following description, for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present embodiments unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present embodiments are not to be construed as limited to specific examples described herein but rather includes within its scope all embodiments defined by the appended claims.

Embodiments for adaptively charging the match lines of a CAM array reduce power consumption by clamping the charging current provided to a match line when the voltage of the match line reaches or exceeds a detectable threshold level during a pre-charge operation. More specifically, for some embodiments, an adaptive match line charging circuit actively monitors the match line voltage level (e.g., using a feedback signal), and halts the match line pre-charging operation once the match line voltage reaches a predetermined level. For some embodiments, the predetermined level corresponds to the minimum voltage level that can be readily interpreted by a match line detection circuit as a match condition.

The adaptive match line charging circuits can be further configured to pre-charge only those match lines corresponding to CAM rows that contain valid data. For such embodiments, each row of CAM cells stores a valid bit indicating whether the corresponding row stores valid data. If the valid bit for a CAM row is asserted (e.g., to indicate that the CAM row stores valid data), the adaptive match line charging circuit adaptively pre-charges the row's match line for the next compare operation. Conversely, if the valid bit for the CAM row is de-asserted (e.g., to indicate that the CAM row does not store valid data), the adaptive match line charging circuit does not pre-charge the row's match line, thereby effectively disabling the CAM row for the next compare operation. By adaptively pre-charging only the match lines for CAM rows that store valid data, power consumption associated with compare operations in the CAM array is further reduced.

For other embodiments, the adaptive match line charging circuits can be configured to adaptively provide a relatively large match line charge current during a pre-charge phase of the compare operation only for rows containing valid data, and a relatively small match line charge current during an evaluation phase of the compare operation. Because the relatively large match line charge current is provided only to rows containing valid data, and only until the voltage on the match line reaches a detectable threshold level, the match line charging rate is optimized for rows containing valid data while current flow (and thus power consumption) is minimized for rows not containing valid data. The relatively small match line charge current provided during the evaluation phase maintains the match lines that indicate a match condition in their charged state to prevent those match lines from inadvertently floating.

FIG. 1 shows an exemplary CAM device 100 within which present embodiments may be implemented. CAM device 100 includes a CAM array 102 that has a plurality of CAM cells (not shown in FIG. 1 for simplicity) arranged in any number of rows and columns. The CAM cells in array 102 may be any suitable type of CAM cell including, for example, binary, ternary, and/or quaternary CAM cells. One or more instructions and related control signals may be provided to CAM device 100 from an instruction decoder (not shown for simplicity) to control read, write, compare, and/or test operations for CAM device 100. Other well-known signals that may be provided to CAM device 100, such as enable signals, reset signals, and clock signals, are not shown for simplicity.

Each row of CAM cells in array 102 is coupled to an address decoder 104 via a corresponding word line WL, and to a priority encoder 106 and to match logic 108 via a corresponding match line ML. The word lines and match lines are represented collectively in FIG. 1 for simplicity. For one embodiment, address decoder 104 receives addresses from an address bus ABUS. For other embodiments, address decoder 104 receives addresses from another bus. The match lines ML provide match results for compare operations to priority encoder 106, which determines the matching entry that has the highest priority number associated with it and generates the index or address of this highest priority match (HPM). Match logic 108 may generate a match flag to indicate a match condition, and may also generate a multiple match flag to indicate multiple matches.

Further, although not shown in FIG. 1 for simplicity, each row of CAM cells in array 102 may have one or more validity bits to indicate whether the corresponding row (or segment thereof) of CAM cells is in a valid state or an empty state. The validity bits may be provided to priority encoder 106 to generate the next free address (NFA) that is available in CAM array 102 for storing new data. The validity bits may also be provided to a well-known full flag logic circuit (not shown for simplicity) to generate a full flag and/or empty flag for CAM array 102.

Each column of CAM cells in array 102 is coupled to a comparand register 110 via comparand lines CL and to a read/write circuit 112 via bit lines BL. The comparand lines and bit lines are represented collectively in FIG. 1 for simplicity. Comparand register 110, which is well-known, provides a comparand word (e.g., search key) received from a comparand bus CBUS to CAM array 102 for comparison with entries stored in CAM array 102. For other embodiments, comparand words may be provided to comparand register 110 from another bus. Read/write circuit 112 includes well-known write drivers and sense amplifiers, and is coupled to a data bus DBUS. During write operations, read/write circuit 112 provides data via the bit lines BL to a row of CAM cells selected by address decoder 104 via the word lines in response to ADDR. During read operations, data read from a row of CAM cells selected by address decoder 104 is provided to read/write circuit 112 via the bit lines BL. Although not shown for simplicity, CAM device 100 may also include a global mask circuit that stores one or more mask patterns that mask entries in CAM array 102 during compare operations with the comparand word provided by comparand register 110.

Figure 2A:
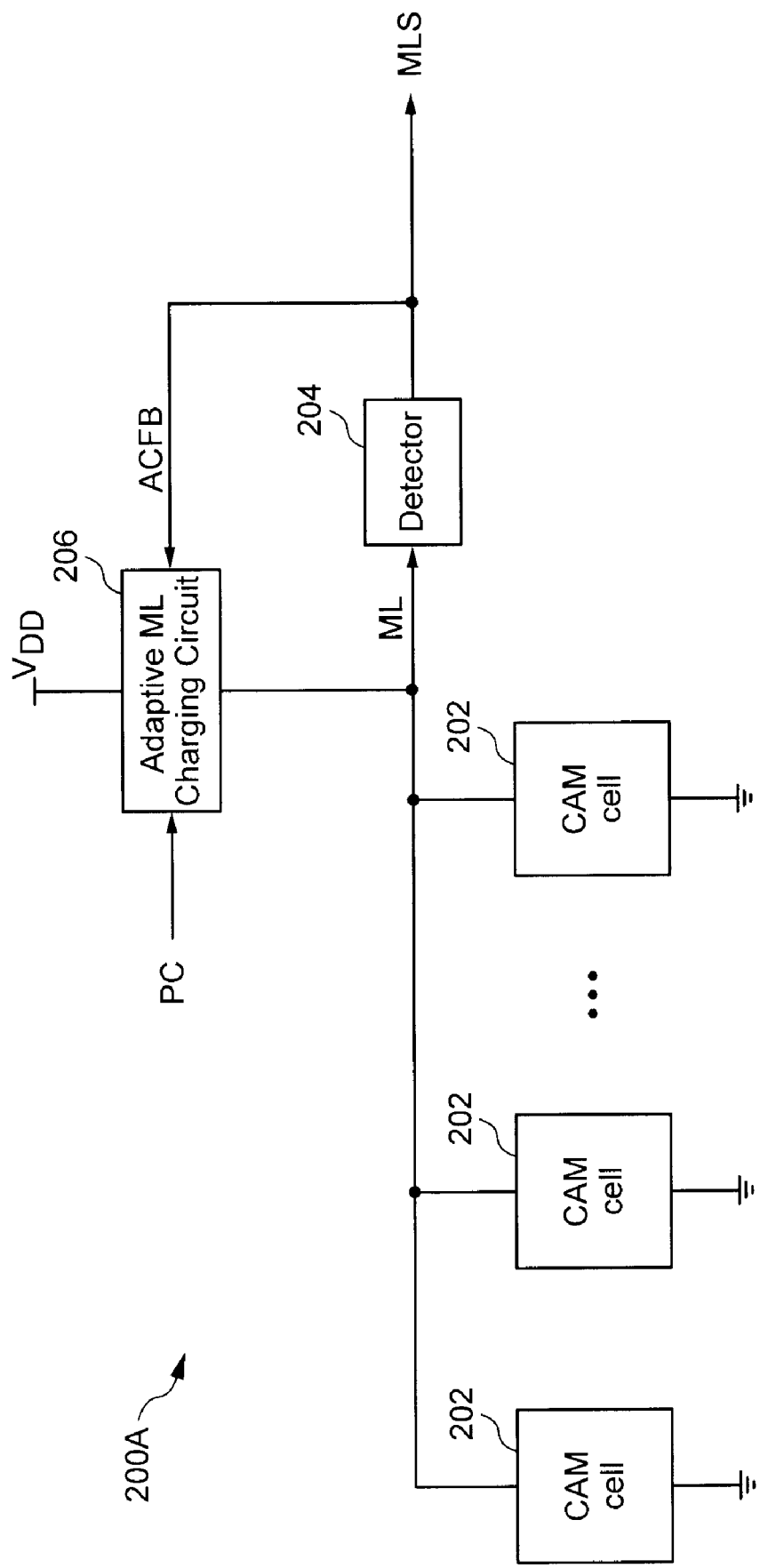
FIG. 2A is a block diagram of a row of a CAM array in accordance with one embodiment.

FIG. 2A is a block diagram of a row 200A that is one embodiment of a row of CAM cells of CAM array 102 of FIG. 1. Row 200A includes a plurality of CAM cells 202, a match line detector circuit 204, and an adaptive match line charging (AMLC) circuit 206. Each CAM cell 202, which can be any suitable type of CAM cell including, for example, a binary CAM cell, a ternary CAM cell, or a quaternary CAM cell, is coupled between a match line ML and ground potential. Although not shown for simplicity, each CAM cell 202 includes at least one storage element to store one or more data bits and includes at least one compare circuit that compares a bit of a search key (e.g., a comparand word) with data stored in the storage element. The storage element can be implemented using Static Random Access Memory (SRAM), Dynamic RAM (DRAM), a non-volatile memory cell (e.g., EEPROM or flash memory cell), or any other suitable memory element. For simplicity, word lines, bit lines, comparand lines, and other well-known elements of the associated CAM array are not shown in FIG. 1. In addition, various well-known clock, enable, and control signals are not shown in FIG. 1 for simplicity.

Match line detector circuit 204, which can be any suitable voltage detection circuit or sense amplifier, includes an input coupled to the match line ML, and includes an output coupled to a sensed match line MLS. Although not shown for simplicity, the other end of the sensed match line MLS can be coupled to the input of a match latch or register that stores match results during compare operations and provides the match results to the priority encoder (see also FIG. 1) to generate the address of the HPM. In operation, match line detector circuit 204 detects the voltage level on the match line ML (hereinafter referred to as the match line voltage $V_{ML}$), and in response thereto drives the sensed match line MLS to either a match state or to a mismatch state. For example, if the voltage $V_{ML}$ is at or above a threshold detection level ($V_T$) of match line detector circuit 204 (e.g., in a logic high state indicating a match condition for the row), then match line detector circuit 204 drives the sensed match line MLS to a logic high state to indicate the match condition. Conversely, if the voltage $V_{ML}$ is below the threshold detection level of the match line detector circuit 204 (e.g., in a logic low state indicating a mismatch condition for the row), then match line detector circuit 204 drives the sensed match line MLS to a logic low state to indicate the mismatch condition.

For other embodiments, the match detector 204 can include a control input to receive an enable signal that can be used to selectively enable and disable the detector circuit 204.

The AMLC circuit 206 is coupled between the match line ML and a supply voltage $V_{DD}$, and includes a first input coupled to the sensed match line MLS and a second input to receive a pre-charge signal PC. The pre-charge signal PC, which selectively enables and disables the AMLC circuit 206, can be generated by any suitable clock circuit, instruction decoder, or another well-known circuit. For some embodiments, the pre-charge signal PC is a clock signal. When enabled (e.g., by an asserted state of PC), the AMLC circuit 206 selectively charges the match line ML high toward $V_{DD}$ by allowing a charging current to flow from $V_{DD}$ to the match line ML. When disabled (e.g., by a de-asserted state of PC), the AMLC circuit 206 does not charge the match line ML.

In accordance with present embodiments, the voltage level on the sensed match line MLS (hereinafter referred to as the sensed match line voltage $V_{MLS}$) is provided as an adaptive charging feedback (ACFB) signal to the AMLC circuit 206, which in response thereto dynamically controls the charging current provided to the match line ML. More specifically, during a pre-charge phase of a compare operation, the AMLC circuit 206 pre-charges the match line ML toward $V_{DD}$ as long as the ACFB signal is in a de-asserted (e.g., logic low) state. When the match line voltage $V_{ML}$ reaches the threshold detection level $V_T$ of the match line detector circuit 204, the detector circuit 204 drives the sensed match line MLS to a logic high state, and the resulting asserted (e.g., logic high) state of the ACFB signal causes the AMLC circuit 206 to stop pre-charging the match line ML. In this manner, the AMLC circuit 206 uses the feedback signal ACFB to adaptively pre-charge the match line ML until the match line voltage $V_{ML}$ reaches the threshold detection level $V_T$ of the match line detector circuit 204, and thereafter clamps the match line voltage $V_{ML}$. Thus, by using the feedback signal to prevent over-charging the match line ML, excess power consumption associated with over-charging the match lines is avoided.

Figure 2B:
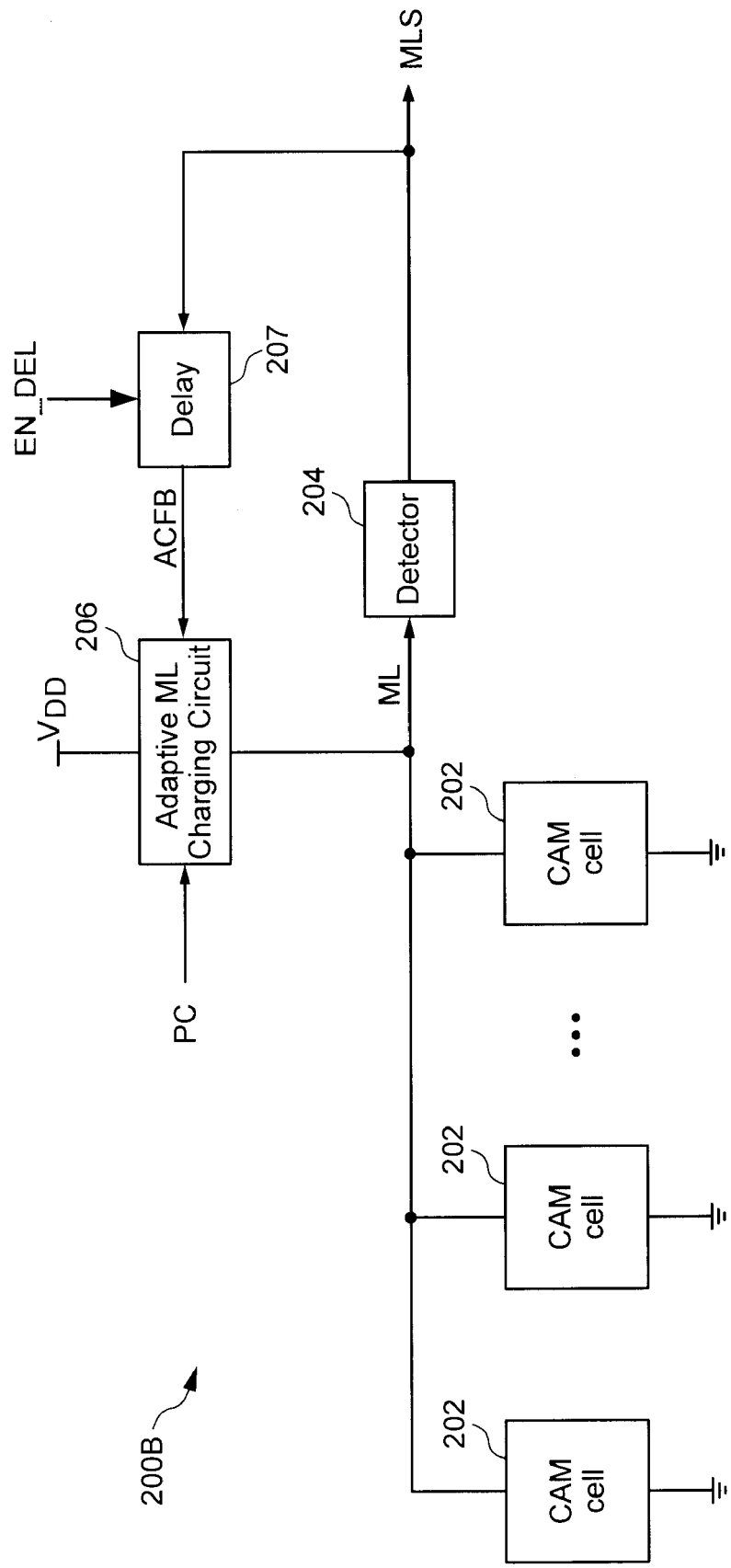
FIG. 2B is a block diagram of a row of a CAM array in accordance with another embodiment.

Referring to FIG. 2B, for other embodiments, the CAM row 200B can include a delay circuit 207 inserted in the feedback path between the sensed match line MLS and the AMLC circuit 206. Delay circuit 207, which can be any suitable delay circuit or element, includes a control input to receive a delay enable signal (EN_DEL) that selectively enables and disables the delay circuit 207. When enabled (e.g., by asserting the signal EN_DEL to logic high), the delay element 207 delays propagation of the feedback signal ACFB from the sensed match line MLS to the AMLC circuit 206 by a predetermined time period, thereby allowing the AMLC circuit 206 additional time (e.g., the predetermined time period longer than without the delay circuit 207) to charge the match line ML to a voltage higher than the threshold detection level $V_T$ of the match line detector circuit 204. By allowing the AMLC circuit 206 to charge $V_{ML}$ to a higher voltage, the delay circuit 207 provides increased margin for the match line voltage $V_{ML}$ during the pre-charge phase of compare operations, which in turn can compensate for process variations inherent in the manufacture of semiconductor devices. More specifically, by including a selectively enabled delay circuit 207 in the feedback path of the ACFB signal, the match line voltage $V_{ML}$ of each CAM row 200B can be individually adjusted in response to corresponding delay enable signals (EN_DEL) to compensate for variations in capacitive loads on different match lines of the CAM array.

Figure 2C:
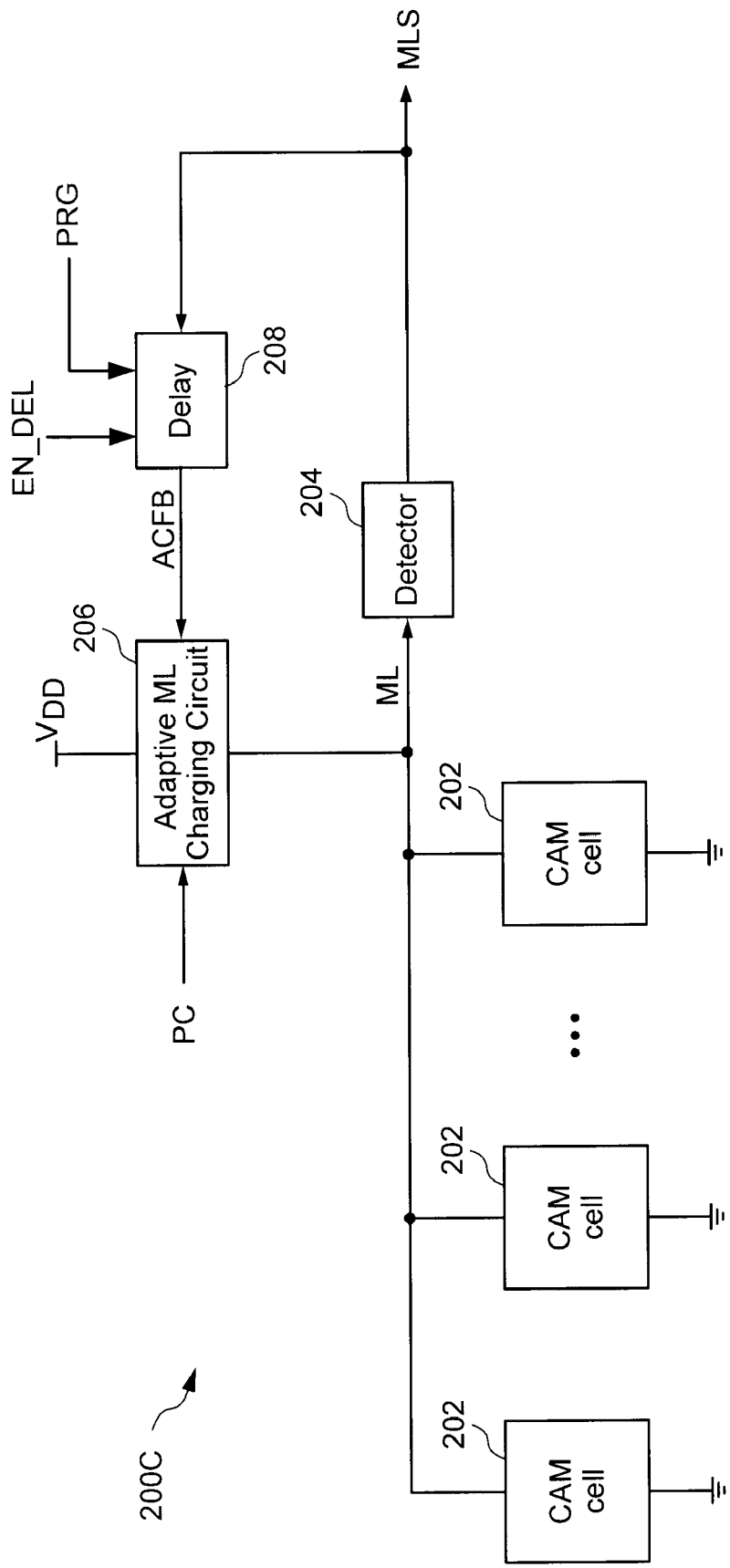
FIG. 2C is a block diagram of a row of a CAM array in accordance with yet another embodiment.

FIG. 2C shows a CAM row 200C in accordance with other embodiments that includes a programmable delay circuit 208 inserted in the feedback path between the sensed match line MLS and the AMLC circuit 206. Programmable delay circuit 208, which can be any suitable programmable delay circuit or element, includes a first control input to receive the delay enable signal (EN_DEL) that selectively enables and disables the delay circuit 208, and includes a second control input to receive a program signal (PRG) that controls the magnitude of the delay provided by the delay circuit 208. For embodiments of FIG. 2C, the magnitude of the delay period provided on the feedback path of each CAM row 200C can be indi-vidually adjusted to selectively and independently modify the match line voltage $V_{ML}$ achieved on each CAM row during the pre-charge phase of the compare operation, thereby providing additional flexibility to compensate for process variations associated with the fabrication of the CAM device.

In accordance with present embodiments, the voltage level on the sensed match line MLS (hereinafter referred to as the sensed match line voltage $V_{MLS}$) is provided as an adaptive charging feedback (ACFB) signal to the AMLC circuit 206, which in response thereto dynamically controls the charging current provided to the match line ML. More specifically, during a pre-charge phase of a compare operation, the AMLC circuit 206 pre-charges the match line ML toward $V_{DD}$ as long as the ACFB signal is in a de-asserted (e.g., logic low) state. When the match line voltage $V_{ML}$ reaches the threshold detection level $V_T$ of the match line detector circuit 204, the detector circuit 204 drives the sensed match line MLS to a logic high state, and the resulting asserted (e.g., logic high) state of the ACFB signal causes the AMLC circuit 206 to stop pre-charging the match line ML. In this manner, the AMLC circuit 206 uses the feedback signal ACFB to adaptively pre-charge the match line ML until the match line voltage $V_{ML}$ reaches the threshold detection level $V_T$ of the match line detector circuit 204, and thereafter clamps the match line voltage $V_{ML}$. Thus, by using the feedback signal to prevent over-charging the match line ML, excess power consumption associated with over-charging the match lines is avoided.

Figure 3:
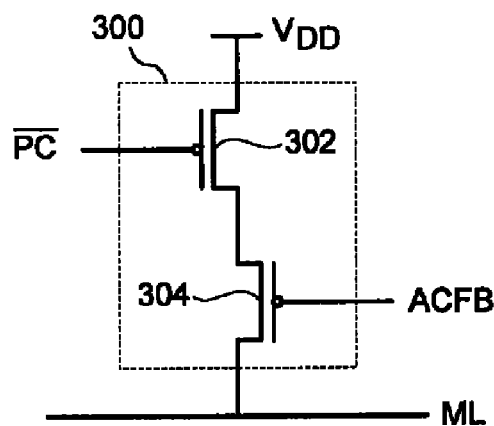
FIG. 3 is a circuit diagram of one embodiment of the adaptive match line charging circuit shown in FIGS. 2A-2C.

FIG. 3 is a circuit diagram of an adaptive match line charging circuit 300 that is one embodiment of the adaptive match line charging circuit shown in FIGS. 2A-2C. The AMLC circuit 300 includes two PMOS transistors 302 and 304 coupled in series between the voltage supply $V_{DD}$ and the match line ML, with the gate of transistor 302 coupled to receive a logically complemented pre-charge signal $\overline{PC}$, and the gate of transistor 304 coupled to receive the feedback ACFB signal. The complemented signal $\overline{PC}$ can be generated from the pre-charge signal PC using any suitable inversion circuit such as, for example, a well-known CMOS inverter circuit (not shown for simplicity).

More specifically, PMOS transistors 302 and 304 control pre-charging of the match line ML in response to a combination of the signals $\overline{PC}$ and ACFB. For example, when the pre-charge signal PC is asserted to a logic high state (e.g., to indicate a pre-charging phase) and the feedback signal ACFB is in a de-asserted logic low state (e.g., indicating that the match line voltage $V_{ML}$ is below the threshold detection level $V_T$ of the match line detector circuit 204), the resulting logic low states of the $\overline{PC}$ and ACFB signals turn on both PMOS transistors 302 and 304 to connect the match line ML to the voltage supply $V_{DD}$, thereby charging the match line ML high toward $V_{DD}$. Conversely, if the pre-charge signal PC is de-asserted to logic low (e.g., indicating an end to the pre-charging phase) or if the ACFB signal is asserted to logic high (e.g., indicating that the match line voltage $V_{ML}$ is at or above the threshold detection level $V_T$ of the match line detector circuit 204), one or both of respective PMOS transistors 302 and 304 are turned off, thereby ceasing the pre-charging of the match line ML.

Figure 4:
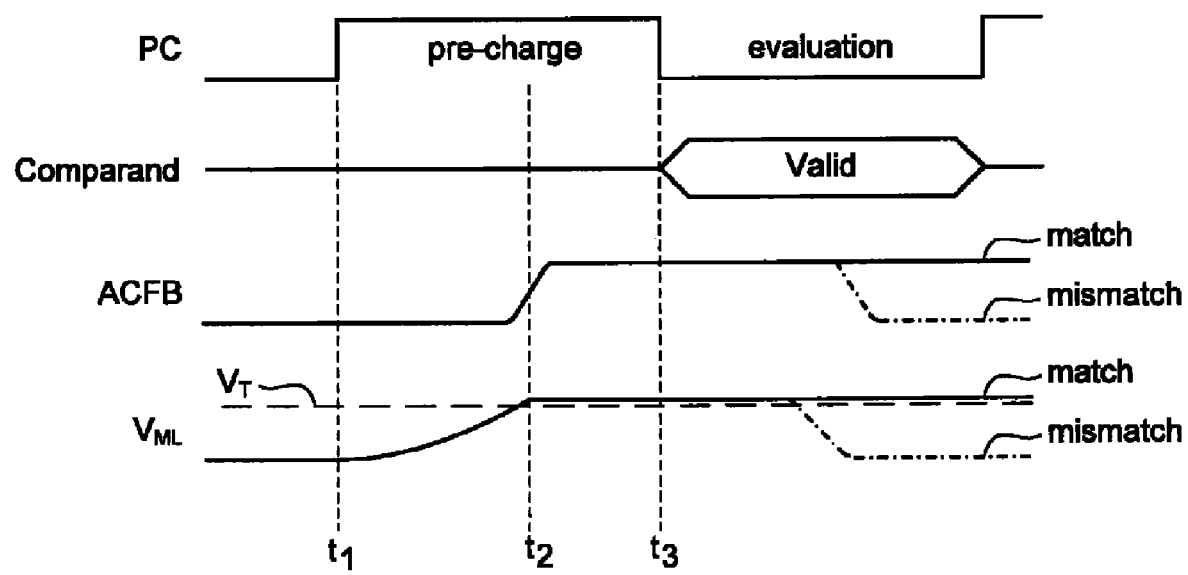
FIG. 4 is a timing diagram illustrating an exemplary operation of one embodiment of the adaptive match line charging circuit of FIG. 3.

An exemplary operation of the AMCL circuit 300 for a compare operation between a comparand word and data stored in CAM cells 202 is described below with respect to the exemplary timing diagram of FIG. 4. During a pre-charge phase of the compare operation, which corresponds to the pre-charge signal PC transitioning from logic low to logic high at time $t_1$, a comparand word is provided to row 200A. For the exemplary timing diagram of FIG. 4, the match line voltage $V_{ML}$ is initially in a logic low state (e.g., at ground potential), which can result from either a "mismatch" condition in a previous compare operation or from device power-on. The adaptive charging feedback signal ACFB is also initially in a logic low state at time $t_1$, thereby indicating that the match line voltage $V_{ML}$ is below the threshold detection level $V_T$ of the match line detector circuit 204 (i.e., $V_{ML}<V_T$). Because both the $\overline{PC}$ and ACFB signals are in logic low states, the AMLC circuit 206 begins charging the match line ML at time $t_1$ by providing a charging current from $V_{DD}$.

At time $t_2$, the match line voltage $V_{ML}$ reaches threshold level $V_T$ of the match line detector circuit 204, which in response thereto drives the sensed match line MLS (and thus the ACFB signal) to a logic high state. The resulting logic high state of the ACFB signal turns off PMOS transistor 304, thereby preventing further pre-charging of the match line ML by isolating the match line ML from $V_{DD}$. In this manner, the AMLC circuit 300 effectively clamps the match line voltage $V_{ML}$ at a level substantially equal to (or just above) the detectable voltage threshold $V_T$ of the detector circuit 204 (i.e., $V_{ML} \geq V_T$) before the end of the pre-charge phase. Thus, power consumption is minimized by adaptively clamping $V_{ML}$ at $V_T$ instead of continuing to charge the match line ML for the remainder of the pre-charge phase. The reduction in power consumption resulting from adaptively clamping the match line voltage $V_{ML}$ during the pre-charge phase of the compare operation is proportional to the number of CAM rows that are pre-charged.

During the evaluation phase of the compare operation, which corresponds to the pre-charge signal PC transitioning from logic high to logic low at time $t_3$, CAM cells 202 become responsive to bit comparisons between the comparand word and data stored in CAM cells 202. If any of the bit comparisons between the comparand word and the data word stored in row 200A mismatch, the corresponding CAM cell(s) 202 discharge match line ML to ground potential to indicate the mismatch condition. Conversely, if all of the bit comparisons result in matches, CAM cells 202 do not discharge match line ML, which in turn remains in its charged state to indicate the match condition. The ACFB signal tracks the match line voltage $V_{ML}$, and thus either remains in a logic high state if the match line ML remains high, or transitions to a de-asserted logic low state if the match line ML is discharged (e.g., to ground potential). Note that for the embodiment of FIG. 3, the de-asserted state of PC (i.e., the resulting logic high state of $\overline{PC}$) disables the AMLC circuit 300 during the evaluation phase, irrespective of the ACFB signal.

Clamping the match line voltage $V_{ML}$ at a voltage level substantially equal to the detection voltage threshold $V_T$ also reduces the amount of charge to be discharged from the match line ML during the evaluation phase if there is a mismatch condition. This allows for faster match resolutions and/or response times in the associated CAM device.

The current-carrying capacities of the PMOS transistors 302 and 304 may be adjusted depending upon desired operating characteristics, as well as upon the size, type, and specific configuration of the CAM cells 202 and their associated array architecture. The PMOS transistor characteristics should be sufficient to provide relatively quick charging of match lines during the pre-charge phase while minimizing power consumption during compare operations. Thus, it is to be understood that the waveforms illustrated for the match line voltage $V_{ML}$ in FIG. 4 are exemplary; for some embodiments, the charge rate (e.g., slope) of the match line voltage $V_{ML}$ may be greater than shown in FIG. 4, while for other embodiments the charge rate of the match line voltage $V_{ML}$ may be less than shown in FIG. 4. Similarly, the discharge rate of the match line voltage $V_{ML}$ may be greater or less than illustrated in FIG. 4.

Note that although the pre-charge signal PC can be de-asserted simultaneously with CAM cells 202 becoming responsive to bit comparisons at time $t_3$, for some embodiments PC is de-asserted slightly before CAM cells 202 become responsive to bit comparisons to avoid having simultaneous control of the match line ML by the pre-charge circuitry and the compare/evaluation circuitry, which could result in inadvertent timing mismatches or delays. For some embodiments, PC can be derived from a clock signal used by the CAM device. For other embodiments, PC is a control signal having a pulse width independent of any clock signal used by the CAM device.

Figure 5:
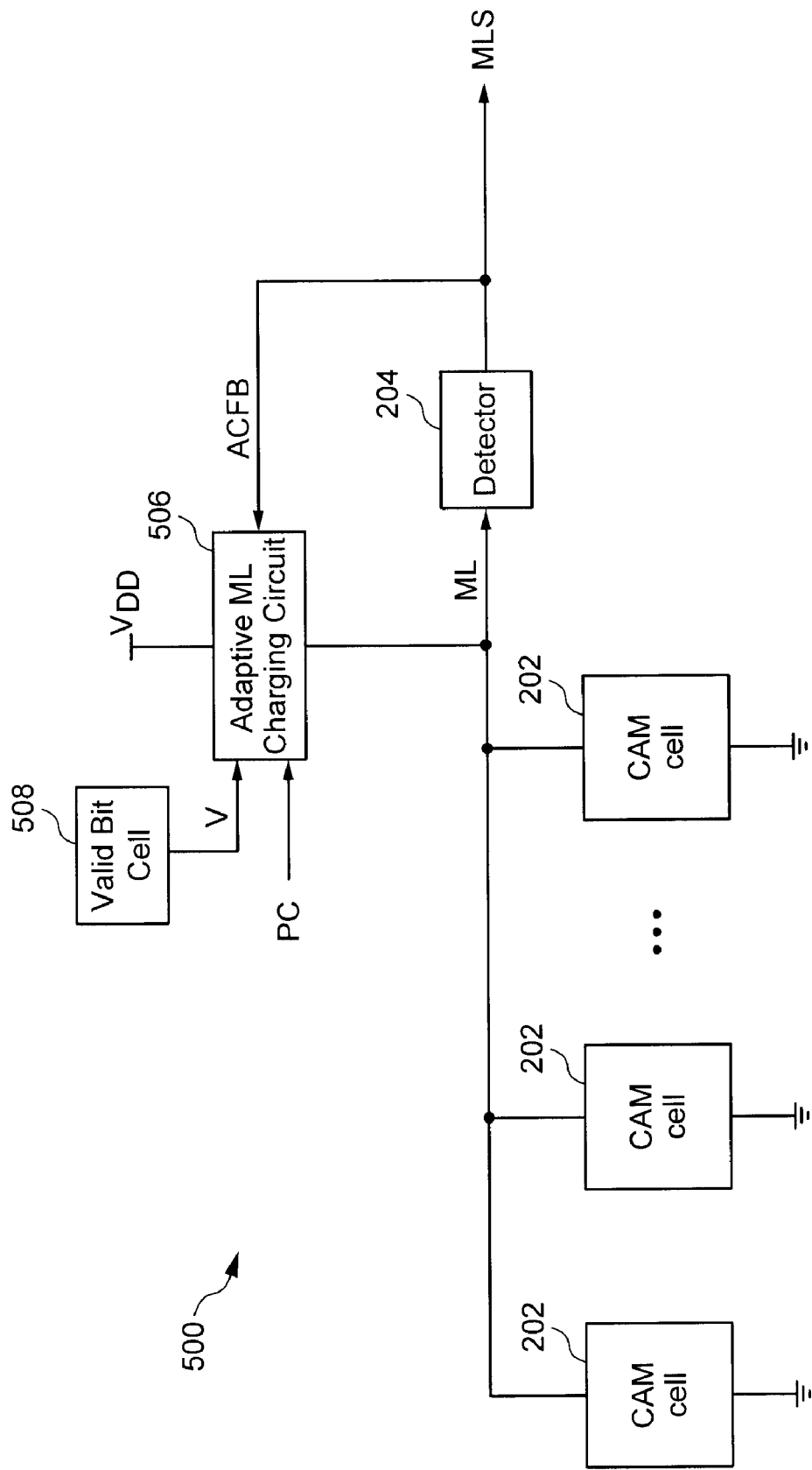
FIG. 5 is a block diagram of a row of a CAM array in accordance with another embodiment.

FIG. 5 is a block diagram of CAM row 500 in accordance with another embodiment. Row 500 includes a plurality of CAM cells 202, match line detector circuit 204, an AMLC circuit 506, and a valid bit cell 508. Valid bit cell 508 stores a valid bit V that indicates whether the CAM cells 202 of row 500 store valid data. For one embodiment, the V bit is asserted to logic high to indicate that row 500 contains valid data, and the V bit is de-asserted to logic low to indicate that row 500 does not contain valid data. Valid bit cell 508 may be any suitable memory element. For some embodiments, valid bit cell 508 is a memory cell such as, for example, a DRAM, SRAM, Electrically Programmable Read Only Memory (EPROM), or Electrically Erasable Programmable Read Only Memory (EEPROM) cell. For other embodiments, valid bit cell 508 is a well-known CAM cell, and may be coupled between match line ML and ground potential. For one embodiment, valid bit cell 508 is identical to CAM cells 202. For other embodiments, valid bit cell 508 can be a latch or register. Further, although shown in FIG. 5 as including only one valid bit cell 508, row 500 may include additional valid bit cells to store multiple valid bits for row 500.

The AMLC circuit 506 is coupled between $V_{DD}$ and the match line ML, and includes inputs to receive the pre-charge signal PC, the feedback signal ACFB from the sensed match line MLS, and the valid bit V. In accordance with present embodiments, the AMLC circuit 506 selectively pre-charges the match line ML depending on whether a valid CAM word is stored in the CAM row 500, as indicated by the logic state of the V bit. More specifically, AMLC circuit 506 operates in a manner similar to that of AMLC circuit 206 of FIGS. 2A-2C, except that the V bit provides a gating function for pre-charging operations. For example, during the pre-charge phase of a compare operation, the AMLC circuit 506 facilitates a flow of charge from the voltage supply $V_{DD}$ to the match line ML only when both of the pre-charge signal PC and the V bit are asserted (e.g., to logic low) and the ACFB signal is de-asserted. In this manner, the AMLC circuit 506 adaptively pre-charges the match line ML using feedback from the sensed match line MLS only if a valid CAM word is stored in row 500.

As discussed above, power consumption is reduced by adaptively clamping $V_{ML}$ instead of charging the match line ML for the entire duration of the pre-charge phase. Moreover, for the exemplary embodiment of FIG. 5, additional power savings are realized by selectively charging only those CAM rows containing valid CAM words. Such power savings are proportional to the percentage of CAM rows that contain invalid data.

Figures 6, 7:
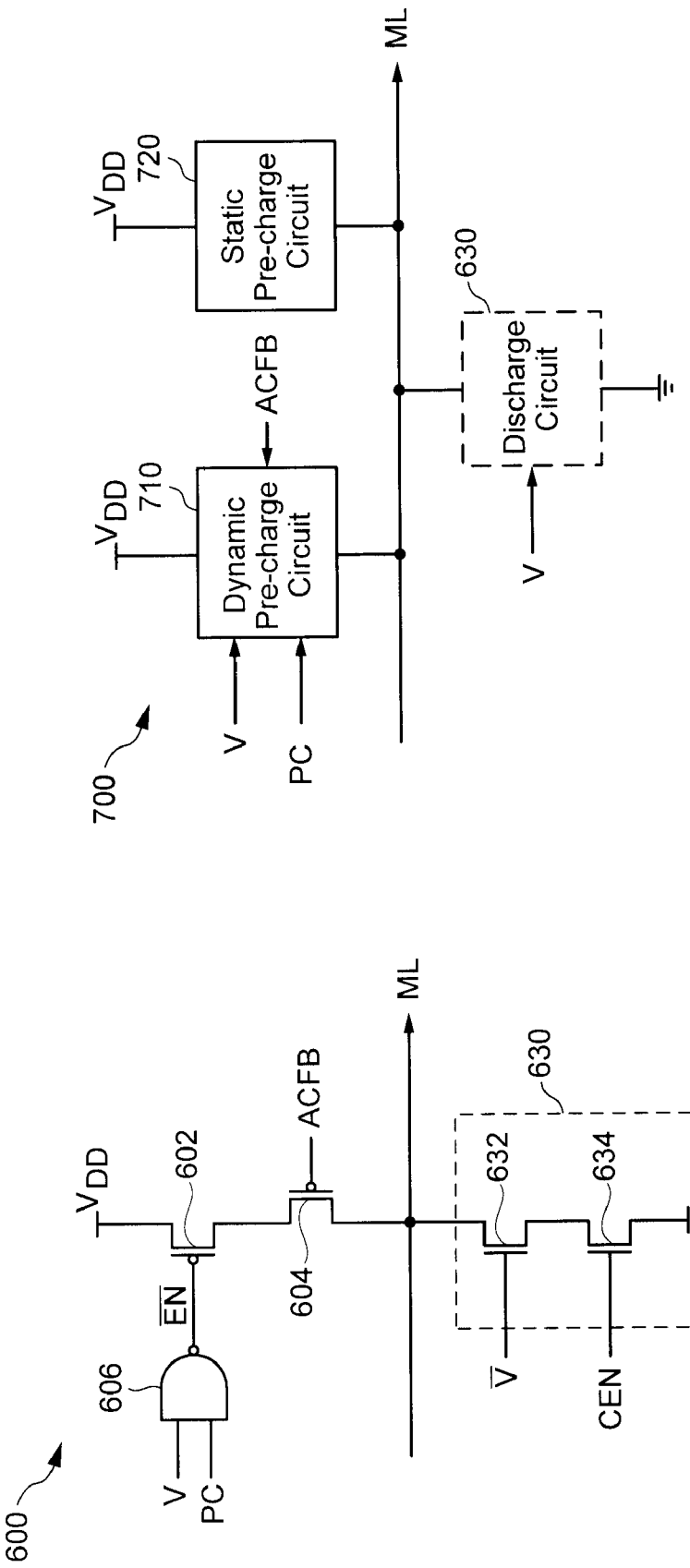
FIG. 6 is a circuit diagram of one embodiment of the adaptive match line charging circuit shown in FIG. 5.
FIG. 7 is a block diagram of another embodiment of the adaptive match line charging circuit shown in FIG. 5.

FIG. 6 is a circuit diagram of an adaptive match line charging circuit 600 that is one embodiment of the AMLC circuit 506 of FIG. 5. AMLC circuit 600 includes two PMOS pull-up transistors 602 and 604 connected in series between $V_{DD}$ and the match line ML, two NMOS pull-down transistors 632 and 634 coupled in series between the match line ML and ground potential, and a NAND gate 606. The gate of PMOS transistor 604 is coupled to receive the ACFB signal, and the gate of PMOS transistor 602 is coupled to receive an active low enable signal $\overline{EN}$ from the output of NAND gate 606, which includes inputs to receive the pre-charge signal PC and the V bit.

NAND gate 606 asserts $\overline{EN}$ to logic low to turn on PMOS transistor 602 during the pre-charge phase of the compare operation (i.e., when PC is asserted to logic high) only if the V bit is asserted to logic high (i.e., indicating that CAM row 600 contains valid data). Otherwise, if the V bit is de-asserted to logic low to indicate that the CAM row does not store valid data, NAND gate 606 de-asserts $\overline{EN}$ to logic high to turn PMOS transistor 602 off, thereby preventing the AMLC circuit 600 from pre-charging the match line ML. In this manner, the AMLC circuit 600 pre-charges the match line ML during the pre-charge phase of the compare operation only if the associated CAM row stores valid data.

As an additional and/or alternative embodiment, the AMLC circuit 600 may include a discharge circuit 630 that discharges the match line ML to a mismatch state if the valid bit indicates that the corresponding row of CAM cells stores invalid data. Discharge circuit 630 includes NMOS pull-down transistors 632 and 634 coupled in series between the match line ML and ground potential. The gate of transistor 632 receives a complemented V bit, which is shown in FIG. 6 as $\overline{V}$. The gate of transistor 634 receives a compare enable signal CEN, which for exemplary embodiments herein is asserted to logic high during compare operations. For one embodiment, CEN may be derived from the pre-charge signal PC. When V=0 (and $\overline{V}$=1) indicating that the CAM row 500 does not store valid data, and CEN=1 during a compare operation, NMOS transistors 632 and 634 turn on and discharge the match line ML towards ground potential, thereby disabling the CAM row for compare operations. If, however, $\overline{V}$=0 (V=1) indicating that the CAM row stores valid data, or if CEN is in a logic low state, transistors 632 and 634 do not discharge the match line ML.

For some embodiments, the polarity of transistors 602 and/or 604 may be suitably reversed in a well-known manner as may be required by specific applications. For example, in one embodiment, transistor 602 may be an NMOS transistor having a gate coupled to receive an active high enable signal EN, and transistor 604 may be an NMOS transistor having a gate to receive a complemented feedback signal $\overline{ACFB}$. Still further, transistor 632 may be a PMOS transistor having a gate to receive the V bit, and transistor 634 may be a PMOS transistor having a gate to receive a complemented compare enable signal $\overline{CEN}$. For an alternative embodiment, transistor 634 may be omitted altogether.

FIG. 7 is a block diagram of an adaptive match line charging circuit 700 that is another embodiment of the AMLC circuit 500 of FIG. 5. AMLC circuit 700 includes a dynamic pre-charge circuit 710 and a static pre-charge circuit 720. As explained in detail below, AMLC circuit 700 adjusts the charge current for match line ML in response to the V bit, the pre-charge signal PC, and the feedback signal ACFB signals to reduce power consumption during compare operations.

Static pre-charge circuit 720 is coupled between the voltage supply $V_{DD}$ and match line ML, and for some embodiments is maintained in a conductive state to continuously charge match line ML toward $V_{DD}$ in both the pre-charge and evaluation phases of a compare operation, thereby ensuring that logic high levels on the match line ML indicating a match condition are maintained throughout the evaluation phase. For example, without static pre-charge circuit 720 continuously charging match line ML, match lines ML indicating a match condition during the evaluation phase may inadvertently leak to ground potential, which in turn can inadvertently switch the logic state of the match line ML. This noise, in turn, may result in erroneous signals on match line ML, thereby decreasing data reliability. Because static pre-charge circuit 720 is maintained in a conductive state, static pre-charge circuit 720 may be referred to as a direct current (DC) pre-charge circuit. For such embodiments, the static pre-charge circuit 720 can be a PMOS transistor having a gate coupled to ground potential, for example, as described below with respect to FIG. 8A.

Dynamic pre-charge circuit 710 is coupled between match line ML and voltage supply $V_{DD}$, and includes inputs to receive the V bit, the pre-charge signal PC, and the feedback signal ACFB. Dynamic pre-charge circuit 710 selectively pre-charges match line ML towards $V_{DD}$ in response to a logical combination of PC and V, and in response to ACFB. During a pre-charge phase of a compare operation (i.e., when PC=1), dynamic pre-charge circuit 710 operates in a manner similar to that of the AMLC circuit 600 described above in with respect to FIG. 6. For example, if the CAM row contains valid data, as indicated by a logic high V bit, and the charge on the match line ML is below the detectable threshold of the match line detector circuit 204 (i.e., $V_{ML}<V_T$), as indicated by a logic low state of ACFB, dynamic pre-charge circuit 710 turns on and quickly charges match line ML by supplementing the charge current provided by static pre-charge circuit 720. Conversely, if the CAM row does not contain valid data, as indicated by a logic low V bit, or if the charge on the match line ML is at or above the detectable threshold (i.e., $V_{ML} \geq V_T$), dynamic pre-charge circuit 710 remains in a non-conductive state and does not supplement the charge current provided by static pre-charge circuit 720. Because dynamic pre-charge circuit 710 selectively pre-charges match line ML, dynamic pre-charge 710 may be referred to as an alternating current (AC) pre-charge circuit.

For some embodiments, dynamic pre-charge circuit 710 has a much larger current-carrying capacity than does static pre-charge circuit 720. In this manner, selectively enabling dynamic pre-charge circuit 710 during the pre-charge phase of the compare operation significantly boosts the match line charge current for rows containing valid data, thereby increasing the speed with which match comparison results may be generated.

By sourcing more of the match line charge current through dynamic pre-charge circuit 710, present embodiments allow the size and current-carrying capacity of static pre-charge circuit 720 to be minimized. Minimizing the current-carrying capacity of static pre-charge circuit 720 further minimizes current flow from $V_{DD}$ to ground potential during the evaluation phase of the compare operation for rows having a mismatch condition (e.g., when one or more CAM cells 202 of row 500 discharge match line ML to ground potential), thereby advantageously reducing power consumption for row 500. Moreover, the constant current flow through static pre-charge circuit 720 may be suitably adjusted so as to maintain match line ML in an acceptable logic high state for rows having a match condition during the evaluation phase of the compare operation, thereby improving data reliability of CAM row 500.

The ratio of current-carrying capacities of static pre-charge circuit 720 and dynamic pre-charge circuit 710 may be adjusted depending upon desired operating characteristics, as well as upon the size, type, and specific configuration of the CAM cells 202 and their associated array architecture. The ratio should be sufficient to provide relatively quick charging of match lines for CAM rows containing valid data while minimizing power consumption during compare operations.

As an additional and/or alternative embodiment, the AMLC circuit 600 may further include a discharge circuit 630 to discharge the match line ML to a mismatch state if the valid bit indicates that the corresponding row of CAM cells stores invalid data. Discharge circuit 630 may function in the same or similar manner as discharge circuit 630, described above in reference to FIG. 6.

Figure 8A:
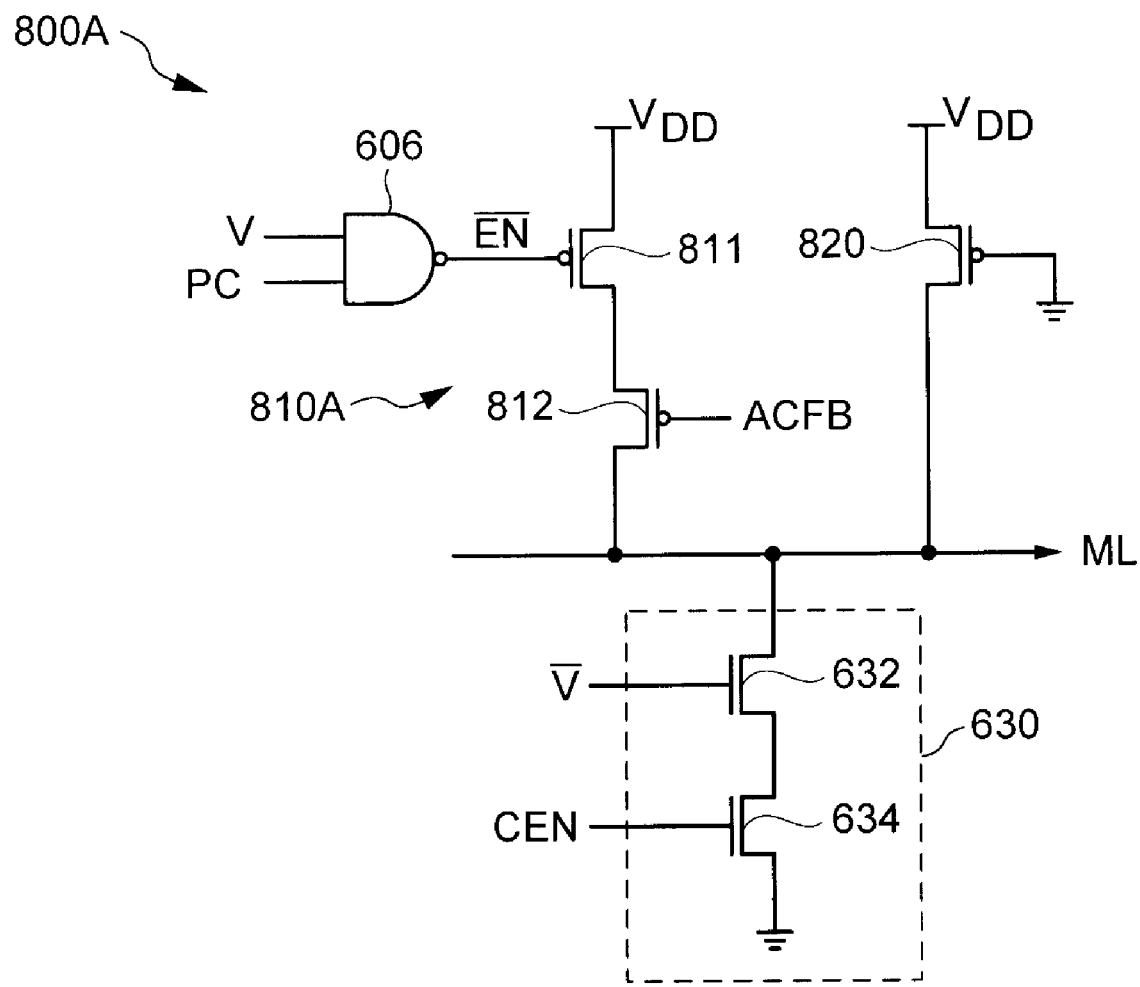
FIG. 8A is a circuit diagram of one embodiment of the adaptive match line charging circuit shown in FIG. 7.

FIG. 8A is a circuit diagram of one embodiment of the adaptive match line charging (AMLC) circuit shown in FIG. 7. The AMLC circuit 800A includes a relatively weak pull-up transistor 820 that is one embodiment of static pre-charge circuit 720, and relatively strong pull-up transistors 811 and 812 that together form a dynamic pre-charge circuit 810A that is one embodiment of dynamic pre-charge circuit 710. The gate of weak pull-up transistor 820 is tied to ground potential and thereby maintains transistor 820 in a conductive state. Strong pull-up transistors 811 and 812 are connected in series, and coupled to the match line ML in parallel with weak transistor 820 to provide an additional charge path between $V_{DD}$ and match line ML. The gate of strong pull-up transistor 811 receives an enable signal $\overline{EN}$ from an output of NAND gate 706, which includes inputs to receive PC and V.

During the pre-charge phase of a comparison operation (i.e., PC=1), NAND gate 606 asserts $\overline{EN}$ to logic low to turn on strong pull-up transistor 811 only if V indicates that the CAM row contains valid data. Otherwise, NAND gate 606 de-asserts $\overline{EN}$ to logic high to turn off strong pull-up transistor 811. Thus, if V=1 and ACFB=0 (and PC=1), both of the strong pull-up transistors 811 and 812 are turned on, which in turn supplements the charge current provided by weak pull-up transistor 820 to quickly pre-charge match line ML during the pre-charge phase when the CAM row contains valid data. On the other hand, if V=0 and/or ACFB=1, NAND gate 606 de-asserts $\overline{EN}$ to turn off at least one of the strong pull-up transistor 811 and/or 812, which in turn minimizes charge current during the pre-charge phase when the CAM row does not contain valid data. During an evaluation phase (i.e., PC=0), NAND gate 606 de-asserts $\overline{EN}$ to turn off strong pull-up transistor 811 to minimize current flowing from $V_{DD}$ to ground potential through mismatching CAM cells 202, irrespective of whether the CAM row contains valid data.

Strong pull-up transistors 811 and 812 have much larger current-carrying capacities than does relatively weak pull-up transistor 820. For one embodiment, one or both of the strong pull-up transistors 811 and/or 812 have a gate length of approximately 0.13 microns and weak pull-up transistor 820 has a gate length of approximately 0.8 microns.

As an additional and/or alternative embodiment, the AMLC circuit 800A may further include discharge circuit 630 to discharge the match line ML to a mismatch state if the valid bit indicates that the corresponding row of CAM cells stores invalid data. Discharge circuit 630 operates in the same or similar manner as any of the discharge circuits previously described.

For some embodiments, the polarity of pull-up transistors 811 and 812, and/or 820 may be suitably reversed in a well-known manner as may be required by specific applications (e.g., as described above with reference to FIG. 6). Furthermore, the polarity of NMOS transistors 632 and 634, forming the discharge circuit 630, may be similarly reversed with little modification to the embodiments described herein. For another embodiment, the gate of weak pull-up transistor 820 may be coupled to receive the valid signal $\overline{V}$ (instead of being coupled to ground potential), so that transistor 820 sources a small charge current for match line ML only if the row contains valid data.

Figure 8B:
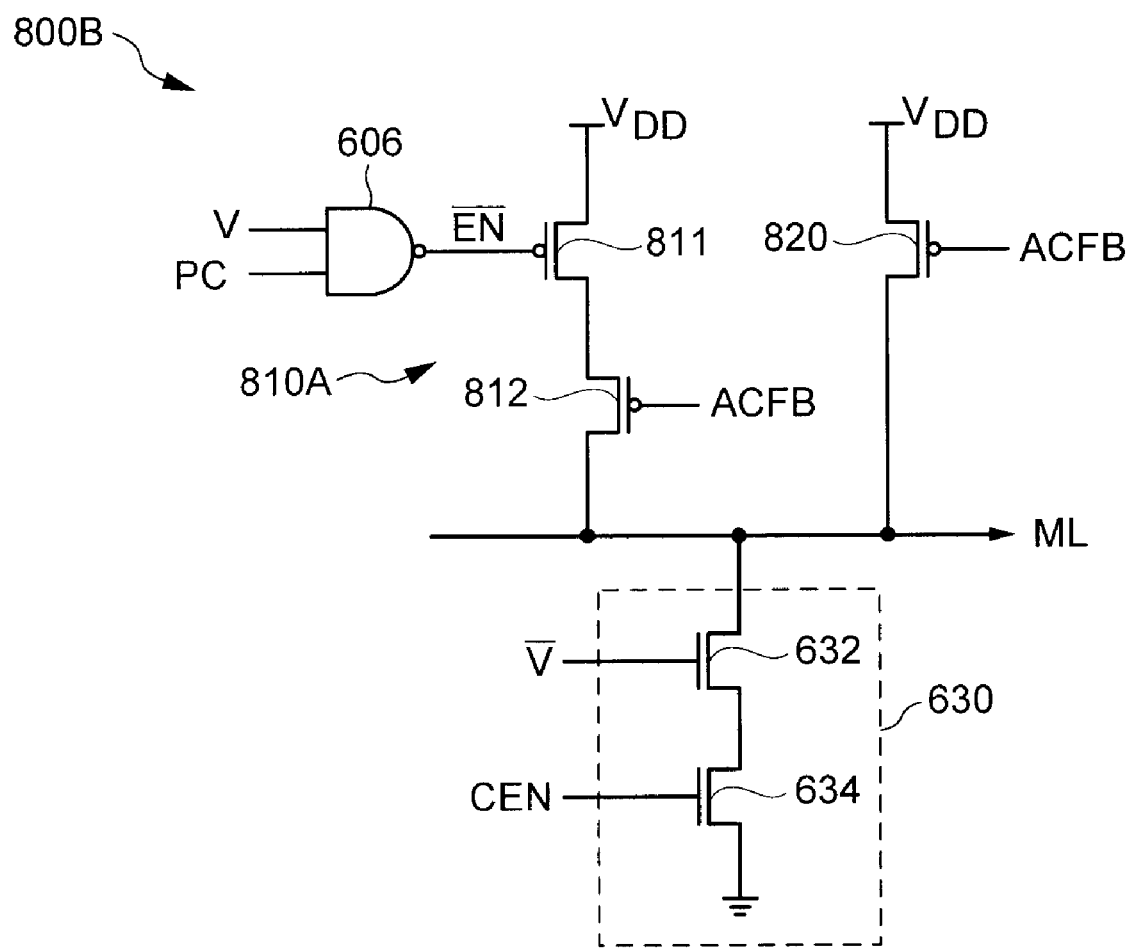
FIG. 8B is a circuit diagram of another embodiment of the adaptive match line charging circuit shown in FIG. 7.

For other embodiments, the static pre-charge circuit 720 of FIG. 7 can include a control terminal responsive to the feedback signal ACFB so that the static pre-charge circuit 720 turns off during the evaluation phase if there is a mismatch condition in the CAM cells in the associated CAM row. For example, FIG. 8B shows an AMLC circuit 800B in which the gate of the PMOS pull-up transistor 820 receives a complemented ACFB signal, $\overline{ACFB}$, that can be generated from the ACFB signal in a well-known manner (e.g., using a CMOS inverter). In this manner, if there is a mismatch condition on the match line ML during the evaluation phase, the resulting logic low state of the match line will result in the logic high assertion of $\overline{ACFB}$, which in turn causes the PMOS pull-up transistor 820 to turn off and prevent a DC current path from $V_{DD}$ to ground potential through transistor 820.

Figure 8C:
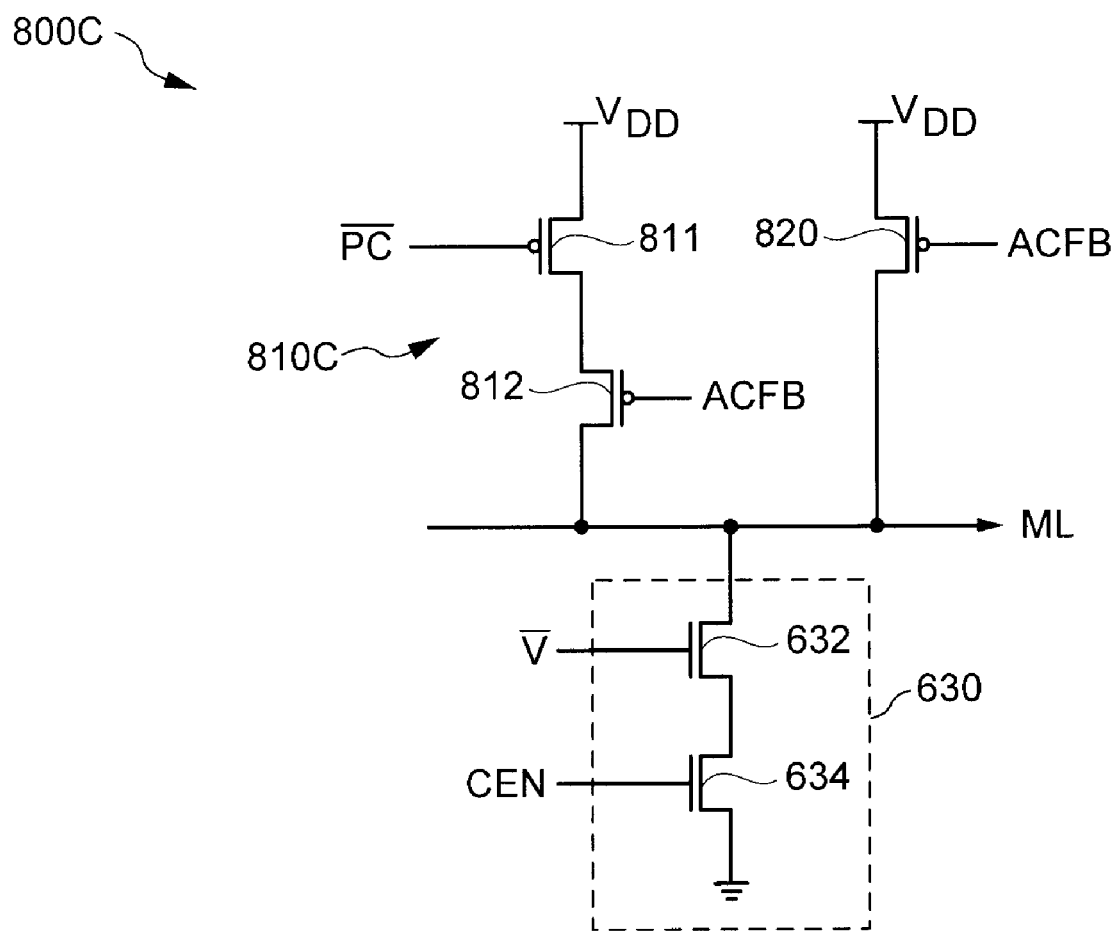
FIG. 8C is a circuit diagram of one embodiment of the adaptive match line charging circuit shown in FIG. 2.

For other embodiments, NAND gate 606 can be omitted, and the gate of pull-up transistor 811 can receive the complemented pre-charge signal $\overline{PC}$, for example, as shown in FIG. 8C.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. For example, although described above in the context of NOR type CAM arrays, embodiments of the present invention may be used control the match lines for NAND type CAM arrays.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

What is claimed is:

1. A content addressable memory (CAM) device having any number of rows, each of the rows comprising:
    a plurality of CAM cells coupled to a match line;
    a match line detector circuit coupled to the match line and configured to detect a voltage of the match line and to generate a pre-charge feedback signal in response to the detected match line voltage, wherein the match line detector circuit asserts the feedback signal if the detected match line voltage exceeds a threshold voltage of the match line detector circuit, and de-asserts the feedback signal if the detected match line voltage is below the threshold voltage of the match line detector circuit; and
    a pre-charge circuit coupled between the match line and a supply voltage and having a first input to receive the feedback signal, wherein the pre-charge circuit is configured to adaptively charge the match line in response to the feedback signal, wherein the pre-charge circuit charges the match line if the feedback signal is de-asserted, and clamps the match line voltage if the feedback signal is asserted.

2. The CAM device of claim 1, wherein during a pre-charge phase of a compare operation, the pre-charge circuit is configured to clamp the match line voltage if the feedback signal indicates the match line voltage exceeds a threshold voltage of the match line detector circuit.

3. The CAM device of claim 1, wherein the pre-charge circuit further comprises a second input to receive a pre-charge signal.

4. The CAM device of claim 3, wherein the pre-charge circuit is selectively enabled in response to the pre-charge signal.

5. The CAM device of claim 1, wherein each CAM row further comprises a valid bit cell for storing a valid bit indicating whether the CAM row contains valid data.

6. The CAM device of claim 5, wherein the pre-charge circuit further comprises a second input coupled to the valid bit cell.

7. The CAM device of claim 6, wherein the pre-charge circuit is enabled for adaptively charging the match line if the valid bit is asserted to indicate that valid data is stored in the CAM row.

8. The CAM device of claim 6, wherein the pre-charge circuit is disabled if the valid bit is de-asserted to indicate that valid data is not stored in the CAM row.

9. The CAM device of claim 5, wherein the pre-charge circuit comprises:
a static pre-charge circuit coupled between the match line and the supply voltage, the static pre-charge circuit providing a relatively small charge current for the match line; and
a dynamic pre-charge circuit coupled between the match line and the supply voltage, the dynamic pre-charge circuit selectively providing a relatively large pre-charge current for the match line in response to the valid bit and the feedback signal.

10. The CAM device of claim 9, wherein the dynamic pre-charge circuit is enabled to charge the match line during a pre-charge phase of a compare operation only if the row contains valid data.

11. The CAM device of claim 10, wherein the dynamic pre-charge circuit is disabled during an evaluation phase of the compare operation.

12. The CAM device of claim 11, wherein the static pre-charge circuit charges the match line during the evaluation phase of the compare operation.

13. The CAM device of claim 9, wherein the pre-charge circuit further comprises:
a discharge circuit coupled between the match line and ground potential, wherein the discharge circuit is configured to discharge the match line if the row does not contain valid data.

14. A content addressable memory (CAM) device having any number of rows, each of the rows comprising:
a plurality of CAM cells coupled to a match line;
a match line detector circuit coupled to the match line and configured to detect a voltage of the match line and to generate a pre-charge feedback signal in response to the detected match line voltage;
a pre-charge circuit coupled between the match line and a supply voltage and having a first input to receive the feedback signal, wherein the pre-charge circuit is configured to adaptively charge the match line in response to the feedback signal; and
a delay circuit coupled between the match line detector circuit and the pre-charge circuit and including a first control input to receive a delay enable signal, wherein assertion of the delay enable signal causes the delay circuit to delay propagation of the feedback signal to the pre-charge circuit, thereby allowing the pre-charge circuit to selectively increase the voltage of the match line on a per-row basis.

15. The CAM device of claim 14, wherein the delay circuit includes a second control input to receive a program signal that controls the amount of delay provided by the delay circuit.

16. A content addressable memory (CAM) device having any number of rows, each of the rows comprising:
a plurality of CAM cells coupled to a match line;
a match line detector circuit having an input coupled to the match line and having an output coupled to a sensed match line, wherein the match line detector circuit selectively drives the sensed match line in response to a detected voltage on the match line;
a pre-charge circuit coupled between the match line and a supply voltage and having a first input coupled to the sensed match line; and
a delay circuit coupled between the match line detector circuit and the pre-charge circuit and including a first control input to receive a delay enable signal, wherein assertion of the delay enable signal causes the delay circuit to delay propagation of the feedback signal to the pre-charge circuit, thereby allowing the pre-charge circuit to selectively increase the voltage of the match line on a per-row basis.

17. The CAM device of claim 16, wherein the pre-charge circuit adaptively charges the match line in response to a feedback signal derived from the sensed match line.

18. The CAM device of claim 17, wherein the match line detector circuit asserts the feedback signal if the detected match line voltage exceeds a threshold voltage of the match line detector circuit, and the match line detector circuit de-asserts the feedback signal if the detected match line voltage is below the threshold voltage of the match line detector circuit.

19. The CAM device of claim 18, wherein the pre-charge circuit charges the match line only if the feedback signal is de-asserted.

20. The CAM device of claim 18, wherein the pre-charge circuit clamps the match line voltage if the feedback signal is asserted.

21. The CAM device of claim 17, wherein each CAM row further comprises a valid bit indicating whether the CAM row contains valid data, and the pre-charge circuit further comprises a second input to receive the valid bit.

22. The CAM device of claim 18, wherein the pre-charge circuit is enabled for adaptively charging the match line only if the valid bit is asserted to indicate that valid data is stored in the CAM row.

23. The CAM device of claim 16, wherein the delay circuit includes a second control input to receive a program signal that controls the amount of delay provided by the delay circuit.

* * * * *